United States Patent [19]
Klaus et al.

[11] 4,238,724
[45] Dec. 9, 1980

[54] PULSE CONTROLLED POTENTIOMETER

[75] Inventors: Thomas R. Klaus, Mount Prospect; John S. Strauss, Schaumburg, both of Ill.

[73] Assignee: Motorola, Inc., Schaumburg, Ill.

[21] Appl. No.: 952,414

[22] Filed: Oct. 18, 1978

Related U.S. Application Data

[63] Continuation of Ser. No. 780,210, Mar. 22, 1977, abandoned.

[51] Int. Cl.³ .................... G05B 24/02; H01C 10/08
[52] U.S. Cl. ......................................... 323/80; 323/97
[58] Field of Search ............... 323/43.5 S, 74, 80, 323/81, 94 R, 97; 333/81 R

[56] References Cited

U.S. PATENT DOCUMENTS

| | | | |
|---|---|---|---|
| 3,370,181 | 2/1968 | Sitomer | 333/81 X |
| 3,731,181 | 5/1973 | Cecil et al. | 323/80 X |
| 3,796,945 | 3/1974 | Feldman et al. | 323/80 X |
| 3,805,145 | 4/1974 | Gordon | 323/80 UX |
| 3,903,434 | 9/1975 | Rauchenecker | 323/43.5 S |
| 4,011,499 | 3/1977 | Betsill et al. | 323/43.5 S |
| 4,014,238 | 3/1977 | Southard | 323/80 X |
| 4,029,974 | 6/1977 | Brokaw | 323/80 X |
| 4,075,536 | 2/1978 | Stevens | 323/43.5 S |

*Primary Examiner*—William H. Beha, Jr.
*Attorney, Agent, or Firm*—James W. Gillman; James A. Scheer

[57] ABSTRACT

A plurality of resistors are series coupled with the free ends forming the end points of the potentiometer. A plurality of electronic switches have each of their inputs coupled to a predetermined point in the resistor array. The output from the switches are connected in common, thus forming the tap to the potentiometer. Activation of the switches is determined by control logic comprising an up/down counter, the outputs from which couple to the switches, an astable multivibrator for incrementing the counter and gating circuitry for selectively coupling the astable to the counter. The control logic is arranged to respond to received command signals for causing the tap to sequentially increment towards either end of the pot and to stop incrementing at a desired point. Further, the control logic causes the sequential tap incrementing to reverse once the tap reaches either end point of the pot.

8 Claims, 4 Drawing Figures

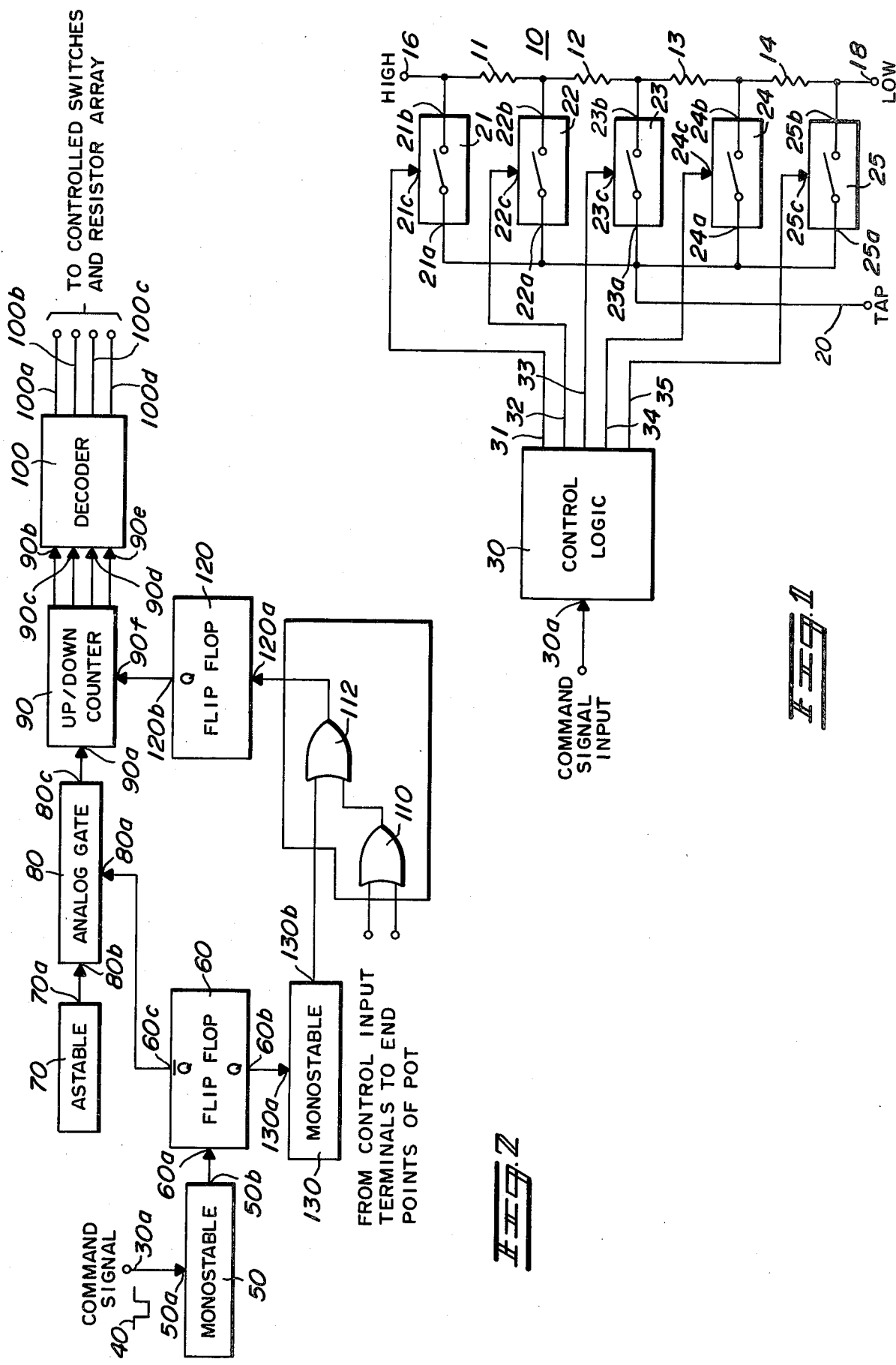

PULSE CONTROLLED POTENTIOMETER

This is a continuation, of application Ser. No. 780,210, filed 3/22/77 now abandoned.

BACKGROUND OF THE INVENTION

The present invention pertains to variable electrical resistance means and, in particular, to a signal controlled potentiometer.

Variable restance means, such as potentiometers, are well known in the electronics art. Commonly, such potentiometers are fabricated by arranging a movable tap to be located at adjustable positions between the end points of a resistive element. A voltage applied across the resistive element may be divided by a given value as determined by the position of the tap.

In many applications, such as the remote control art, the user may wish to vary the tap position of a potentiometer which is within equipment remotely located from the user. For example, in the communication art it is not uncommon for a user to vary the tuning of a remotely located receiver or transmitter by sending a coded tone over the telephone lines to the receiver or transmitter site and providing at that site a decoder suitable for responding to the coded tone to activate a motor which in turn positions the tap of a tuning potentiometer.

Such motorized potentiometers have proven undesirable in many applications since they are expensive, and bulky.

SUMMARY OF THE INVENTION

It is an object of this invention, therefore, to provide an improved potentiometer which may be controlled from a remote location.

Briefly, according to the invention, the improved potentiometer is signal controlled and is comprised of a plurality of predetermined value resistors. The resistors are series connected in a predetermined sequence, with the free ends of the series connected resistors comprising the end connections of the potentiometer. A plurality of controlled switch means is provided, each switch including first and second terminals, control terminals and means responsive to a control signal at the control terminal to connect the first switch terminal to the second switch terminal thereby activating the switch. The first terminals of all switches are coupled in common thereby forming the tap of the potentiometer. The second terminal of each switch is coupled to a predetermined portion of the series connected resistor. Preferably, each switch is coupled to a common connection of two of the resistor means and switches are also coupled to each end of the potentiometer. A control logic means is provided which has a command input terminal, adapted to receive command signals thereat, and a plurality of controlled outputs. Each control logic means output couples to the control input of a predetermined one of the switches. The control logic means includes means responsive to a received command signal to apply a control signal to the control terminal of a predetermined switch. Thus, the activated switch provides the desired tap output from the potentiometer.

BRIEF DESCRIPTION OF THE DRAWINGS

FIG. 1 is a schematic diagram illustrating general construction of the improved potentiometer according to the invention;

FIG. 2 is a block diagram of the preferred embodiment of the invention which provides several automatic potentiometer functions.

DETAILED DESCRIPTION OF THE PREFERRED EMBODIMENT OF THE INVENTION

Figure 3A:
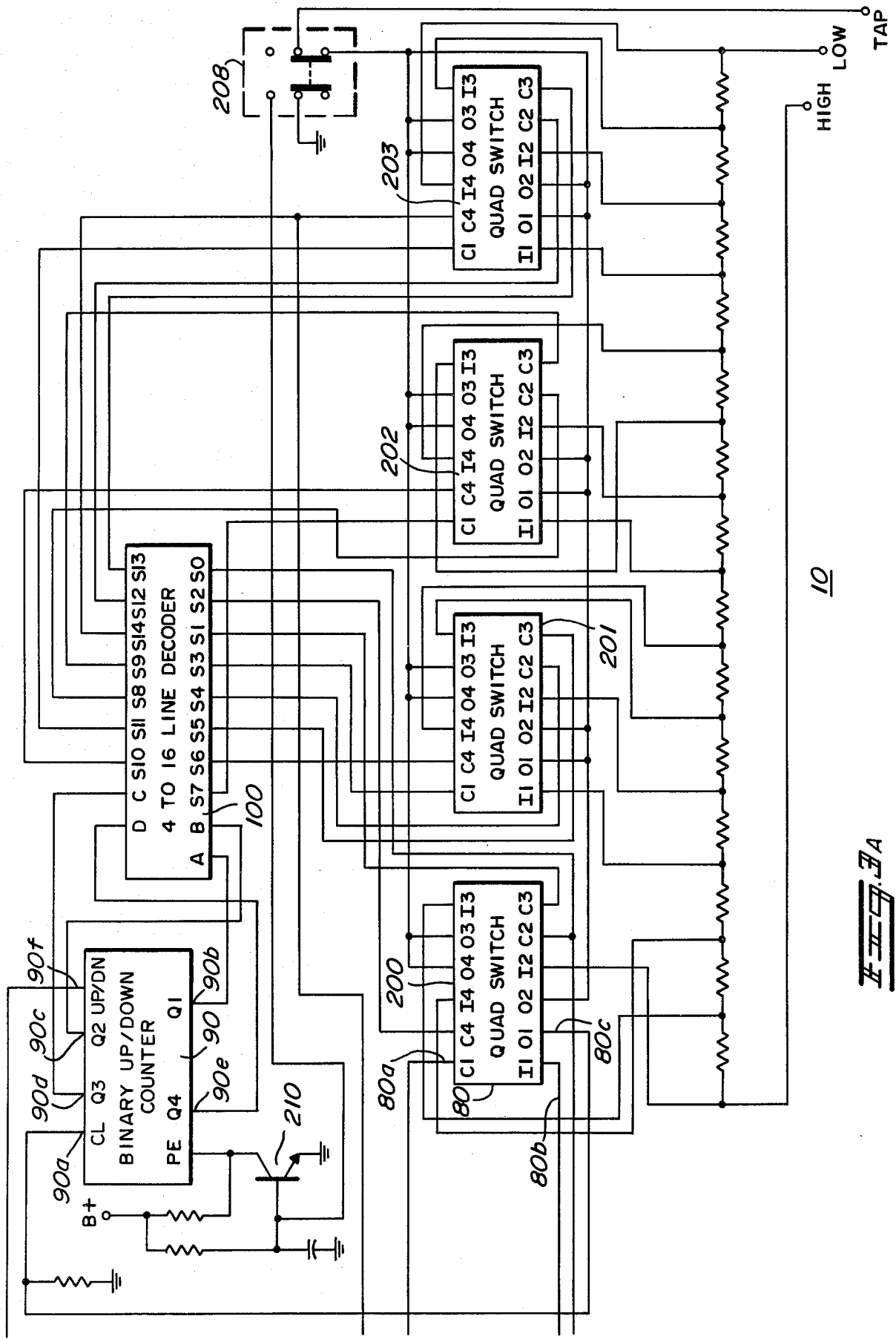
FIGS. 3A and 3B are detailed schematic diagrams of a preferred embodiment of the invention.

FIG. 1 illustrates general construction of a signal controlled potentiometer according to the invention. Here, a series of four resistors 11–14 are series connected to form a resistor array 10. The free ends of the resistors comprise the end points of the potentiometer 16, 18. While this embodiment of the invention contemplates four series connected resistors, it should be understood that any number might be used for a given application. The total sum of the resistors values determines the overall resistance of the potentiometer. Correspondingly, the total sum of the resistors tolerances determines the tolerance of the potentiometer, and the particular resistor values and their placement in the array 10 determine the taper characteristics of the "pot".

A plurality of five controlled switches 21–25 are provided. Each switch has a first terminal 21a–25a, a second terminal 21b–25b and a control terminal 21c–25c. The first terminals 21a–25a of all switches 21–25 are connected in common thereby comprising the tap 20 of the potentiometer. The second terminal 21b–25b of each switch 21–25 is connected to a predetermined portion of the resistor array 10. In particular, the first and last switch second terminals 21b–25b connect to the end points 16–18 respectively of the array 10 and the remaining switch second terminals 22b–24b connect to the common connection of the resistors 11–14.

Each switch 21–25 responds to a control signal being applied to its control input 21c–25c to connect its first terminal to its second terminal, thus activating the switch.

Switch activation is determined by control logic circuitry 30. The control logic circuitry 30 has a command input terminal 30a and five output terminals 31–35, each output terminal being connected to a predetermined one of the control terminals 21c–25c of the control switches 21–25. The control logic circuitry 30 responds to received command signals at its command input 30a to apply a control signal to the control terminal of a predetermined one of the switches, thereby activating the switch to provide a desired output from the potentiometer at its tap 20. Thus, by suitable construction of the control logic circuitry 30, the command signal, which may be generated from a remote location and transmitted to the command input 30a of the control logic 30, causes a desired positioning of the tap to the potentiometer.

FIG. 2 is a detailed block diagram illustrating construction of the multifunction control logic according to the preferred embodiment of the invention. Here, a command signal 40 is applied to the control logic input 30a for control of the potentiometer. In the aforementioned system wherein potentiometer control may be determined from a coded tone over a telephone line, the command signal 40 may result from appropriate tone decoders. The command signals are applied to the input 50a of a monostable multivibrator 50. Operating in the conventional manner, the monostable multivibrator 50 responds to a pulse at its input 50a to cause its output 50b to activate from a first to a second state for a predetermined time interval. The output from the monostable 50 is applied to the input 60a of a D type toggle flip-flop 60. D type flip-flop 60 is of conventional design having a Q output 60b and a $\overline{Q}$ output 60c. The toggle flip-flop 60 responds to a pulse from the monostable multivibrator 50 to cause its outputs Q and $\overline{Q}$ to flip to an opposite logic state.

The $\overline{Q}$ output 60c from the toggle flip-flop 60 couples to the input 80a of an analog gate 80. The analog gate 80 responds to the $\overline{Q}$ output 60c of the toggle gate 60 being in a logic high state to couple signals at its analog input 80b to its output 80c. Thus, when the $\overline{Q}$ output 60c from the toggle gate 60 is in the logic high level, oscillating signals generated by an astable multivibrator 70 at its output 70a appear at the analog gate output 80c, whereas when the $\overline{Q}$ output 60c is in a low logic level, the oscillating signals are inhibited.

The output 80c from gate 80 is coupled to the input 90a of an up/down counter 90. Up/down counter 90 is of conventional design and responds to signal transitions at its input 90a to sequentially activate a selective one or ones of its outputs 90b-90e. Up/down counter 90 also includes a mode input terminal 90f which responds to either a logic "1" or logic "0" level being applied thereat to cause the counter to sequence in either its predetermined up or down mode, respectively.

The outputs 90b-90e from the up/down counter 90 are passed to decoder circuitry 100. The decoder circuitry responds to selective ones of the up/down counter outputs 90b-90e being activated to produce an appropriate control signal on one of its outputs 100a-100d, which control signals are coupled to appropriate switches to thereby control the output tap from the potentiometer.

Thus, when a first command signal 40 is applied to the monostable 50, the monostable toggles the D type flip-flop 60 whereby its $\overline{Q}$ output goes high. This, through the analog gate 80, passes oscillating signals from the multivibrator 70 to the up/down counter 90.

In response to transitions at its input 90a, and to a logic "1" level at its mode input 90f, the up/down counter 90 sequentially up counts its outputs 90b-90e. These outputs are then decoded by the decoder 100 which sequentially activates its outputs 100a-100d in a first predetermined order whereby sequential switches are closed causing the tap to incrementally move towards the high end (16 in FIG. 1) of the potentiometer.

The sequence continues until either a second command signal is received or until the tap increments to the high end of the pot. If a second command signal is received at the control logic input 30a, the monostable 50 is again activated to produce a pulsed output. The monostable signal causes the D type flip-flop to toggle to its opposite state whereby the $\overline{Q}$ output 60c goes low. This, in turn, decouples the input 80b of the analog gate 80 from its output 80c. Thus, the up/down counter 90 is no longer incremented such that the output tap from the potentiometer remains at the position it was in when the second command signal was received.

If the tap on the potentiometer increments to the high end point of the resistor array (or, for that matter the low end) before a second command signal is received, the system increments in the reverse predetermined order, which may be understood as follows. The switches coupled to both the high and the low ends of the resistor array (e.g. switches 21 and 25 in FIG. 1) have their control input terminals coupled to an OR gate 110. The output from OR gate 110 feeds to one of two inputs of a second OR gate 112, whose output feeds to the input 120a of a toggle flip-flop 120. The Q output from the toggle flip-flop 120, in turn, couples to the mode input 90f of the up/down counter 90. During operation in the response to the first command signal, the Q output from the toggle flip-flop 120 assumed the logic "1" state whereby the counter 90 operated in its up count mode. However, OR gate 110 becomes satisfied when the tap on the potentiometer increments to that switch corresponding to the high end of the resistor array. This in turn causes OR gate 112 to be satisfied whereby it produces an output pulse which, when applied to the input 120a of toggle gate 120 causes the Q output of toggle gate 120 to switch stages. Now subsequent oscillator signals pass from the astable 70 through the analog gate 80 to the up/down counter 90 causing counter 90 to operate in the down count mode. This results in the switches being activated in the reverse predetermined order whereby the tap begins incrementing towards the low end of the pot.

In this mode, the tap continues incrementing towards the low end of the pot until a subsequent, or fourth command signal is received, which inhibits further sequencing identically to the manner described hereinabove, or until the tap reaches the switche corresponding to the low end of the pot. Since OR gate 110 also couples to the control input terminal of the switch corresponding to the low end of the pot (switch 25 of FIG. 1) OR gate 110, as well as OR gate 112 becomes satisfied once the tap reaches the low end of the array thereby toggling the input 120a of toggle flip-flop 120 thus changing the counter to its up count mode.

By reversing the direction that the tap increments once it reaches an end point on the pot, the system responds in a manner similar to a conventional potentiometer.

A further refinement to this system includes an additional monostable multivibrator 130 whose input 130a couples to the Q output 60b of the D type toggle flip-flop 60. The monostable 130 responds to a signal transition from a low level to a high level at its input 130a to produce a high level at its output 130b, which in turn is coupled to the second input of OR gate 112.

Hence, when the first command signal is applied to the input 50a of the monostable 50, the $\overline{Q}$ output 60c of flip-flop 60 makes a transition from a low to a high stage thereby activating analog gate 80. Correspondingly, the Q output from flip-flop 60 makes a transition from a high to a low state which is insufficient to produce a pulse from the monostable 130. However, a second command signal at the monostable 50a causes the flip-flop 60 to reverse the logic state at its outputs whereby its Q output makes a transition from a low level to a high level. This causes the monostable 130 to produce an output pulse at its output 130b, which pulse satisfies the OR gate 112 thereby causing it to toggle flip-flop 120 and switch up/down counter 90 to its down count mode. A subsequent, or third command signal to the monostable 130 thereby causes sequential downcounting of up/down counter 90 with the result that the tap moves towards the low end of the resistor array in the reverse predetermined order. Thus, the response of the system is such that an operator begins sequentially upmoving the tap towards the high end of the pot by sending a first command signal. The operator may then inhibit sequential operation by sending a second command signal. If he feels that the tap has moved too far towards the high end of the pot, the operator may send a third command signal which, due to the reversing of the mode of the up/down counter 90, causes the tap to move towards the low end of the pot in the reverse predetermined order, thereby allowing an operator to fine tune the position of the tap. A fourth received command signal will toggle the flip-flop 60 thereby inhibiting the sequential tap incrementing and maintain the tap coupled to its position in the resistor array which existed during receipt of the fourth command signal.

Figure 3B:
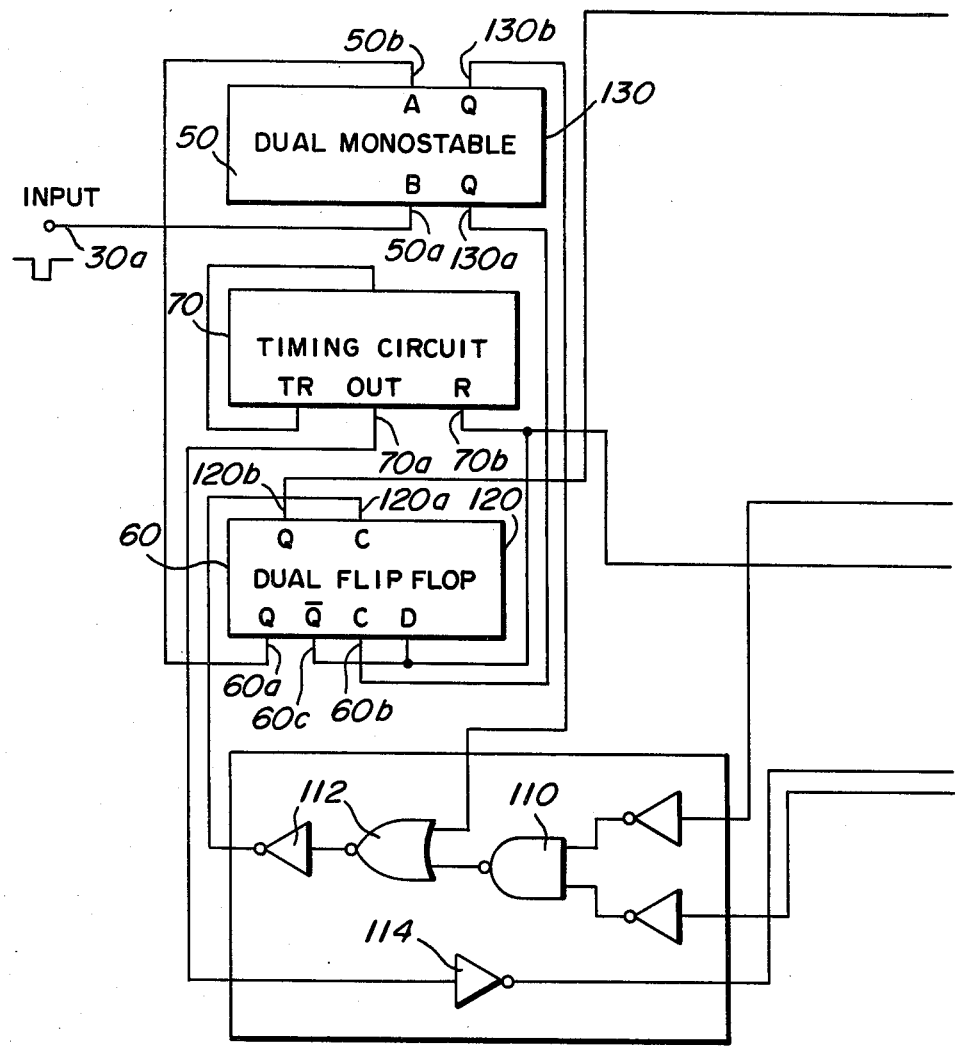

FIGS. 3A and 3B are detailed schematic diagrams of a preferred embodiment of the invention. It should be noted that FIG. 3 is not complete in every detail, that is, connections to DC bias supplies or to external components, such as timing resistors or capacitors, has been deleted for purpose of figure clarity. Proper values for and connections of these deleted components would be easily derived by one of ordinary skill in the art, especially in view of the fact that listed hereinbelow are the integrated circuit part numbers contemplated by the preferred embodiment of the invention, which part numbers are readily available from Motorola, Inc.

Command signals are received at the control logic input 30a and are passed to the trigger input 50a of the monostable multivibrator 50. The monostable 50 is comprised of one half of a Motorola part number MC 14528 integrated circuit. The remaining half of this dual monostable integrated circuit is utilized as the second monostable multivibrator 130. The output 50b from the monostable 50 couples to the input 60a of a D flip-flop 60. The D flip-flop 60 is comprised of one half of a Motorola type MC 14013 dual type D flip-flop, whose other half is utilized as flip-flop 120. The output 60c from the D flip-flop 60 couples both to an astable multivibrator input 70b, here fabricated from a Motorola MC 1555 timing integrated circuit, and to the input 80a of an analog gate 80 which is here comprised of one fourth of a quad switch Motorola type MC 14016. It should be noted that in this embodiment of the invention the astable 70 is inhibited from oscillating when the $\overline{Q}$ output 60c is at its low level. An oscillating signal from the astable output 70a passes through the analog gate 80 and is applied to the binary up/down counter 90 fabricated from a Motorola part number MC 14516 integrated circuit. For purposes of making the output 70a from the MC 1555 astable compatible with the input 80b of the MC 14516 up/down counter 90, the astable output is passed through an inverter stage 114. The counter 90 may be activated either to its up or down count mode dependent upon the signal at its mode input 90f. The outputs 90b-90e from the counter 90 are coupled to a four-to-sixteen line decoder 100, which is here fabricated from a Motorola part number MC 14514 integrated circuit. The decoder 100 includes fifteen output lines, each of which couples to the control input of one of fifteen signal controlled switches contained within the four integrated circuits 200-203. Each integrated circuit comprises four switches, with each switch having an input, an output and a control input. Motorola part number MC 14016 type quad switches are contemplated for use in this embodiment.

The output from the second monostable 130 couples to one input of the OR gate 112, whose second input couples from the output of OR gate 110. The inputs of OR gate 110 connect to the switches controlling the end points of the resistor array 10. Thus, as described with respect to FIG. 2, the flip-flop 120 may reverse the counter 90 between its up and down count modes.

A further refinement of the system shown in FIG. 3 is the inclusion of a switch 208 and a transistor 210, with related components, which connects to the preset input of the binary up/down counter 90. When switch 208 is thrown to its alternate position from that shown in FIG. 3, transistor 210 is activated thereby presetting the binary up/down counter 90 to a predetermined count state. This locates the tap at a predetermined position in the resistor array. Thus, despite the location of the tap prior to activating switch 208, the tap may be reset to a given predetermined point.

In summary, the preferred embodiment of an improved signal controlled potentiometer has been described. The potentiometer requires the use of no motors or other bulky mechanical structures whereby it may be fabricated in an inexpensive, compact and reliable manner.

While a preferred embodiment of the invention has been described in detail, it should be apparent that many modifications and variations thereto are possible, all of which fall within the true spirit and scope of the invention.

We claim:

1. A signal controlled potentiometer comprising:

a plurality of predetermined value resistor means;

means fkor series connecting said resistors in predetermined sequence, with the free ends of the series connected resistors comprising the end connections of the potentiometer;

a plurality of controlled switch means, each switch means including first and second terminals, control terminal, and means responsive to a control signal at the control terminal to connect said first terminal to said second terminal thus activating said switch, wherein a first one of the controlled switch means has its second terminal coupled to one free end of the series connected resistors and a last one of the controlled switch means has its second terminal coupled to the other free end of the series connected resistors;

means for common coupling the first terminals of said switches, said common connection comprising the top of said potentiometer;

means for coupling the second terminal of each switch to a predetermined portion of the series connected resistor means; and control logic means having a commond input terminals adapted to receive command signals and a plurality of controlled outputs, each output being coupled to the control input of a predetermined one of the controlled switch means, the logic means including means responsive to a received command signal to apply a control signal to the control terminal of a predetermined one of the switch means, said control logic means further including means responsive to a first received command signal to generate control signals for sequentially activating said switch means in a predetermined order, inhibit means responsive to a second received command signal to inhibit sequential activation of said switch means and to maintain activated that switch which was activated prior to reception of said second received command signal, and further including means for sequentially activating said switch means in the reverse of said predetermined other in response to a predetermined one of said switch means being activated, thereby activating said switch and providing a desired tap output from the potentiometer.

2. The signal controlled potentiometer of claim 1 wherein the control logic means includes for generating control signals to sequentially activate said switch means from the reverse of said predetermined order to said predtermined order in response to a predetermined second one of said switch means being activated.

3. The signal controlled potentiometer of claim 1 wherein the control logic means comprises:
   counter means having an input terminal and a plurality of output terminals, each output terminal being coupled to a predetermined one of the switch means control terminals, the counter means responsive to signal transitions at its input terminal to activate the switch means in the predetermined order;
   oscillator means for producing a predetermined frequency oscillating signal; and
   gating means responsive to said first received command signal to couple said oscillator means to the counter means input terminal.

4. The signal controlled potentiometer of claim 3 wherein the gating means comprises means responsive to said second received command signal to decouple said oscillator from the counter means input terminal.

5. The signal controlled potentiometer of claim 2 wherein the control logic means comprises:
   counter means having an input terminal and a plurality of output terminals, each output terminal being coupled to a predetermined one of the switch means control terminals, the counter means responsive to signal transistions at its input terminal to activate the switch means in the predetermined order;
   oscillator means for producing a predetermined frequency oscillating signal; and
   gating means responsive to said first received command signal to couple said oscillator means to the counter means input terminal.

6. The signal controlled potentiometer of claim 5 wherein the counter means comprises means responsive to a reverse order control input signal to sequentlly activate the switches from the predetermined order to the reverse predetermined order; and
   wherein the control logic means further comprises means to apply a reverse order control input signal to said counter means responsive to said predetermined one of said switch means being activated and to remove said reverse order control input signal from said counter means responsive to said predetermined second one of said switch means being activated.

7. The signal controlled potentiometer of claim 1, 2, 5 or 6 wherein the control logic means comprises presettable means to automatically activate a preselected switch.

8. The signal controlled potentiometer of claim 1 wherein the counter means has a provided control input terminal for activating the switch means in either the predetermined order or the reverse of said predetermined order in response to control signals received at said control input terminal and wherein the control logic means includes means for applying a control signal to said counter means control input terminal for causing said counter to activate the switches in the predetermined order in response to one of the first and last switch means being activated and in the reverse of said predetermined order in response to the other of said first and last switch means being activated.

* * * * *

UNITED STATES PATENT AND TRADEMARK OFFICE
CERTIFICATE OF CORRECTION

PATENT NO. : 4,238,724
DATED : 12/9/80
INVENTOR(S) : THOMAS R. KLAUS ET AL.

It is certified that error appears in the above—identified patent and that said Letters Patent is hereby corrected as shown below:

Col. 1, line 11, "restance" should be -- resistance --.
Col. 2, line 39, "to" should be -- in --.
Col. 3, line 8, "Q" should be -- $\overline{Q}$ --.
Col. 3, line 24, "Upon" should be -- Up/down --.
Col. 4, line 30, "switche" should be -- switch --.
Col. 6, line 30, "fkor" should be -- for --.
Col. 6, line 47, "top" should be -- tap --.
Col. 6, line 51, "commond" should be -- command --.
Col. 7, line 2, "other" should be -- order --.
Col. 7, line 11, "predtermined" should be -- predetermined --.
Col. 8, line 10, "sequently" should be -- sequentially --.

Signed and Sealed this

Fourteenth Day of April 1981

[SEAL]

Attest:

RENE D. TEGTMEYER

Attesting Officer          Acting Commissioner of Patents and Trademarks